(12) United States Patent
Zhang et al.

(10) Patent No.: US 10,930,518 B2
(45) Date of Patent: Feb. 23, 2021

(54) OLED SUBSTRATE AND MANUFACTURING METHOD THEREOF, DISPLAY DEVICE AND MANUFACTURING METHOD THEREOF

(71) Applicant: BOE TECHNOLOGY GROUP CO., LTD., Beijing (CN)

(72) Inventors: Feng Zhang, Beijing (CN); Zhijun Lv, Beijing (CN); Wenqu Liu, Beijing (CN); Liwen Dong, Beijing (CN); Shizheng Zhang, Beijing (CN); Ning Dang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/326,787

(22) PCT Filed: May 17, 2018

(86) PCT No.: PCT/CN2018/087301
§ 371 (c)(1),
(2) Date: Feb. 20, 2019

(87) PCT Pub. No.: WO2018/214802
PCT Pub. Date: Nov. 29, 2018

(65) Prior Publication Data
US 2019/0198592 A1   Jun. 27, 2019

(30) Foreign Application Priority Data
May 23, 2017   (CN) .............................. 201710368041

(51) Int. Cl.
*H01L 21/308*   (2006.01)
*H01L 27/32*    (2006.01)
(Continued)

(52) U.S. Cl.
CPC ........ *H01L 21/3086* (2013.01); *H01L 21/308* (2013.01); *H01L 27/3246* (2013.01);
(Continued)

(58) Field of Classification Search
CPC ............. H01L 51/0001; H01L 51/0002; H01L 51/0014; H01L 51/0015; H01L 51/0016;
(Continued)

(56) References Cited

U.S. PATENT DOCUMENTS

2008/0124824 A1 * 5/2008  Tsai .................... H01L 27/3211
                                                                438/29
2010/0045173 A1 * 2/2010  Kwon ................. H01L 27/3246
                                                                313/504
(Continued)

FOREIGN PATENT DOCUMENTS

CN     104157668 A     11/2014
CN     105489631 A     4/2016
(Continued)

OTHER PUBLICATIONS

First Office Action of CN; Application No. 201710368041.X; dated Apr. 26, 2019; English Translation Attached.
(Continued)

*Primary Examiner* — Eduardo A Rodela
(74) *Attorney, Agent, or Firm* — Nath, Goldberg & Meyer; Joshua B. Goldberg (57) ABSTRACT

The present disclosure provides an OLED substrate and a manufacturing method thereof, a display device and a manufacturing method thereof, and belongs to the technical field of display technology. A manufacturing method for an OLED substrate of the present disclosure includes: forming, by a patterning process, a pattern including first electrodes of OLED devices and a pixel defining layer provided above the first electrodes above the base substrate, wherein the (Continued)

pixel defining layer includes a plurality of pixel partition walls spaced apart from each other, each of the pixel partition walls defines one of the first electrodes.

8 Claims, 4 Drawing Sheets

(51) Int. Cl.
*H01L 51/52* (2006.01)
*H01L 51/56* (2006.01)
*H01L 51/00* (2006.01)

(52) U.S. Cl.
CPC ...... *H01L 27/3248* (2013.01); *H01L 27/3272* (2013.01); *H01L 51/0014* (2013.01); *H01L 51/0015* (2013.01); *H01L 51/0018* (2013.01); *H01L 51/5218* (2013.01); *H01L 51/5271* (2013.01); *H01L 51/56* (2013.01); *H01L 2227/32* (2013.01); *H01L 2227/323* (2013.01); *H01L 2251/56* (2013.01)

(58) Field of Classification Search
CPC ............ H01L 51/0017; H01L 51/0018; H01L 51/0021; H01L 51/0023; H01L 51/52; H01L 51/5209; H01L 51/5237; H01L 27/32; H01L 27/3202; H01L 27/3258; H01L 21/02642; H01L 21/027; H01L 21/0273; H01L 21/0274; H01L 21/308; H01L 21/3086; H01L 21/32139
See application file for complete search history.

(56) References Cited

U.S. PATENT DOCUMENTS

| | | | |
|---|---|---|---|
| 2011/0025659 A1* | 2/2011 | Kwak | G09G 3/3233 345/205 |
| 2012/0049169 A1 | 3/2012 | Kim | |
| 2014/0332762 A1 | 11/2014 | Kim et al. | |
| 2015/0279324 A1* | 10/2015 | Ohta | G09G 3/3283 345/690 |
| 2016/0225834 A1* | 8/2016 | Kim | H01L 27/3246 |
| 2016/0307976 A1 | 10/2016 | You | |
| 2017/0053973 A1* | 2/2017 | Park | H01L 51/5237 |
| 2017/0104181 A1* | 4/2017 | Lee | H01L 27/3246 |
| 2017/0256597 A1* | 9/2017 | Lee | H01L 27/3276 |
| 2019/0198592 A1 | 6/2019 | Zhang et al. | |
| 2019/0259967 A1* | 8/2019 | Yang | H01L 51/0023 |

FOREIGN PATENT DOCUMENTS

| | | |
|---|---|---|
| CN | 106067474 A | 11/2016 |
| CN | 106469746 A | 3/2017 |
| CN | 107170782 A | 9/2017 |
| KR | 20040102654 A | 12/2004 |

OTHER PUBLICATIONS

PCT International Search Report; Application No. PCT/CN2018/087301; dated Aug. 1, 2018; Form PCT/ISA/210 and PCT/ISA/237 with English Translation.

* cited by examiner

OLED SUBSTRATE AND MANUFACTURING METHOD THEREOF, DISPLAY DEVICE AND MANUFACTURING METHOD THEREOF

CROSS-REFERENCE TO RELATED APPLICATION

This is a National Phase Application filed under 35 U.S.C. 371 as a national stage of PCT/CN2018/087301, filed May 17, 2018, an application claiming the benefit of Chinese Patent Application No. 201710368041.X filed on May 23, 2017, the disclosure of which is hereby incorporated by reference.

TECHNICAL FIELD

The present disclosure relates to the field of display technology, and in particular, to an OLED substrate and a manufacturing method thereof, a display device and a manufacturing method thereof.

BACKGROUND

With the continuous advancement of science and technology, visual information is becoming more and more important in people's lives. Therefore, flat panel displays carrying visual information are also playing an increasingly important role in people's lives. These common flat panel displays include liquid crystal displays (LCDs), organic light emitting diode (OLED) displays, and the like.

SUMMARY

The present disclosure provides a manufacturing method for an OLED substrate, including: forming, by a single patterning process, a pattern including first electrodes of OLED devices and a pixel defining layer provided above the first electrodes above a base substrate, wherein the pixel defining layer includes a plurality of pixel partition walls spaced apart from each other, each of the pixel partition walls defines one of the first electrodes.

In some implementations, the step of forming, by a single patterning process, a pattern including first electrodes of OLED devices and a pixel defining layer provided above the first electrodes above a base substrate, wherein the pixel defining layer includes a plurality of pixel partition walls spaced apart from each other, each of the pixel partition walls defines one of the first electrodes includes steps of: depositing a material for the first electrodes and a material for the pixel defining layer sequentially above the base substrate; exposing the material for the pixel defining layer with different precisions to form a fully exposure area, a partially exposure area and an unexposure area; developing and etching the material for the pixel defining layer in the fully exposure area and the partially exposure area to remove the material for the pixel defining layer in the fully exposure area to expose a portion of the material for the first electrodes corresponding to the fully exposure area; etching the exposed material for the first electrodes to form the first electrodes; and removing remaining material for the pixel defining layer in the partially exposure area to form the pixel partition walls.

In some implementations, the manufacturing method further including: before the step of forming, by a single patterning process, a pattern including first electrodes of OLED devices and a pixel defining layer provided above the first electrodes above a base substrate, forming layered-structures of a thin film transistor and a planarization layer sequentially on the base substrate.

In some implementations, the thin film transistor is a low temperature polysilicon thin film transistor or an oxide thin film transistor.

In some implementations, the manufacturing method further including: after the step of forming, by a single patterning process, a pattern including first electrodes of OLED devices and a pixel defining layer provided above the first electrodes above a base substrate, forming a spacer above the base substrate and between adjacent OLED devices.

In some implementations, the manufacturing method further including: after the step of forming, by a single patterning process, a pattern including first electrodes of OLED devices and a pixel defining layer provided above the first electrodes above a base substrate, forming a light emitting layer and a second electrode sequentially on each of the first electrodes.

In some implementations, the first electrodes are made of a conductive and reflective material.

In some implementations, the conductive and reflective material includes ITO/Ag/ITO.

The present disclosure further provides an OLED substrate including a plurality of OLED devices, each of the OLED devices including a first electrode and a pixel defining layer provided above the first electrode, the pixel defining layer including a pixel partition wall, a boundary of an orthographic projection of the pixel partition wall on the base substrate coincides with a boundary of an orthographic projection of the first electrode of the OLED device on the base substrate.

In some implementations, the pixel partition wall includes two pixel partition sub-walls.

In some implementations, the OLED device further includes a light emitting layer and a second electrode, wherein the light emitting layer is provided on the first electrode and between the two pixel partition sub-walls, the second electrode is provided above the two pixel partition sub-walls and electrically coupled to the light emitting layer.

The present disclosure further provides a display device including the above OLED substrate.

BRIEF DESCRIPTION OF THE DRAWINGS

To enable those skilled in the art to better understand the technical solutions of the present disclosure, the present disclosure will be further described in detail below with reference to the accompanying drawings and specific embodiments.

An OLED substrate generally includes a base substrate, and a planarization layer, an anode and a pixel defining layer provided on the base substrate in this order. In a manufacturing process of an existing OLED substrate, the anode and the pixel defining layer are usually manufactured by two process steps after the formation of the planarization layer, and when the pixel defining layer is manufactured on the anode after the anode is manufactured, due to large exposure, light may transmits through the anode to irradiate to a thin film transistor below the planarization layer, causing a threshold voltage Vth of the thin film transistor to drift, which affects the stability of the OLED substrate. In addition, the manufacturing process in which the anode and the pixel defining layer are separately manufactured may cause problems such as a reduced productivity and an increased cost.

Referring to FIG. 1 to FIG. 9, an embodiment of the present disclosure provides a manufacturing method for an OLED substrate, including following steps S1 to S4.

Figure 1:
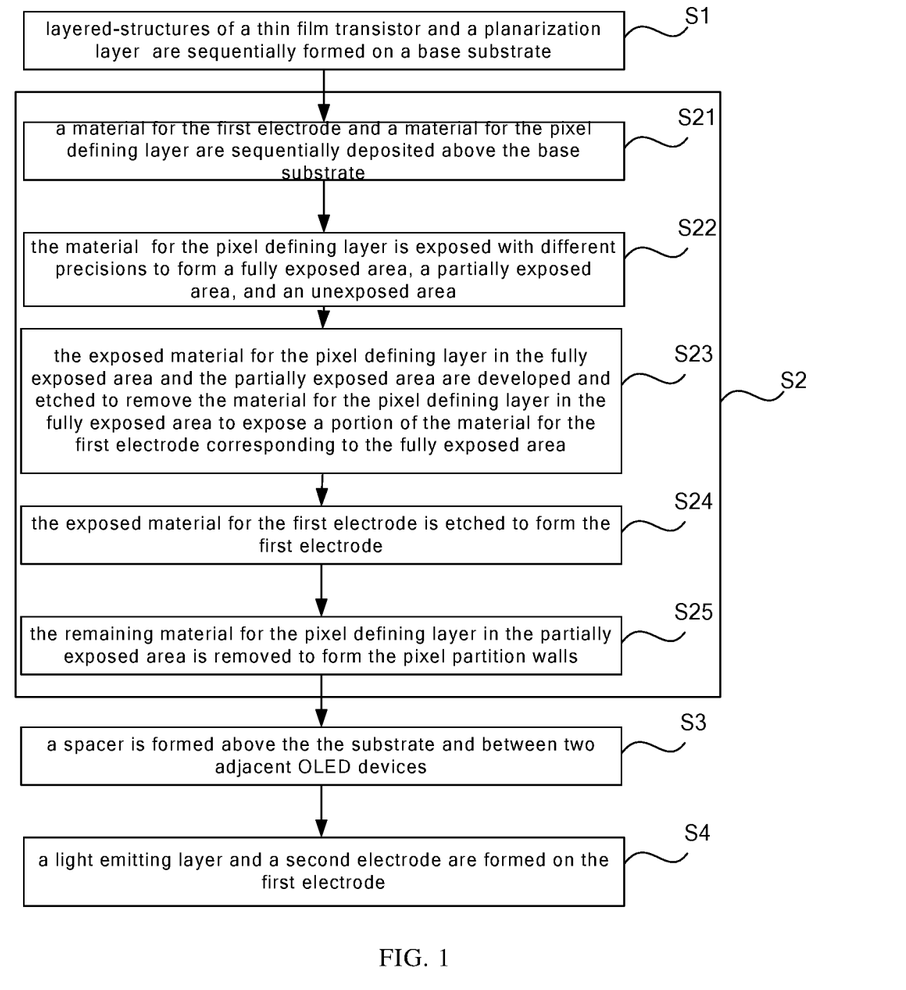
FIG. 1 is a schematic flow chart of a manufacturing method for an OLED substrate according to an embodiment of the present disclosure.

In step S1, layered-structures of a thin film transistor and a planarization layer 8 are sequentially formed on a base substrate 1.

The thin film transistor is a low temperature polysilicon thin film transistor or an oxide thin film transistor. Certainly, the type of the thin film transistor is not limited thereto, and will not be described herein.

Figure 2:
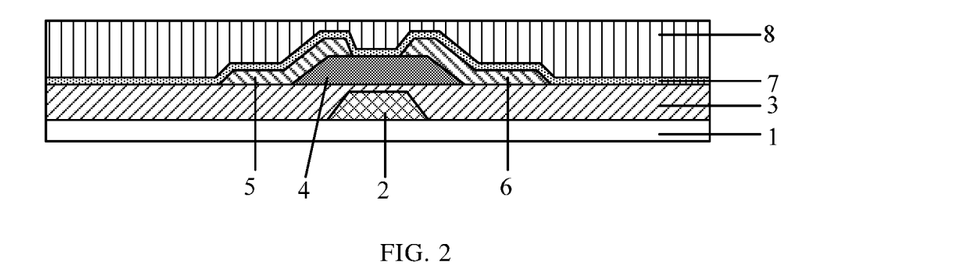
FIG. 2 is a schematic structural diagram of an OLED substrate, after a step S1 is completed, according to an embodiment of the present disclosure.

Referring to FIG. 2, in the case where the thin film transistor is an oxide thin film transistor, the oxide thin film transistor includes a gate 2, a gate insulating layer 3, a metal oxide layer 4 (i.e., an active layer), a source 5, a drain 6, and an insulating layer 7, which are sequentially formed on the base substrate 1. A planarization layer 8 is formed on the insulating layer 7.

Figure 3:
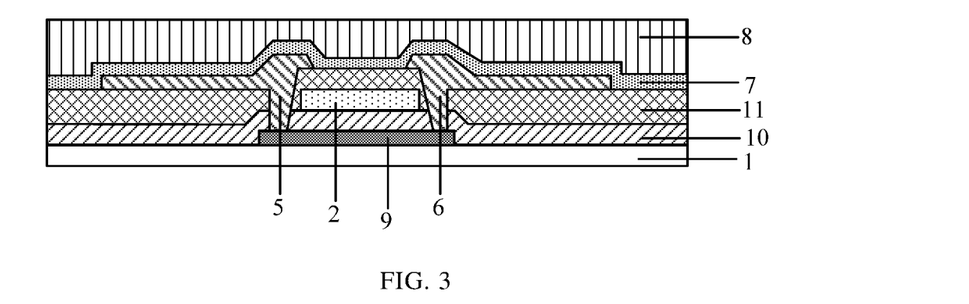
FIG. 3 is another schematic structural diagram of an OLED substrate, after a step S1 is completed, according to an embodiment of the present disclosure.

Referring to FIG. 3, in the case where the thin film transistor is a low temperature polysilicon thin film transistor, the low temperature polysilicon thin film transistor includes a low temperature polysilicon layer 9 (i.e., an active layer), a buffer layer 10, a gate 2, an interlayer dielectric layer 11, a source 5, a drain 6 and an insulating layer 7, which are sequentially formed on the base substrate 1. A planarization layer 8 is formed on the insulating layer 7.

It should be noted that, in the present embodiment, description is made by taking the thin film transistor of a bottom gate structure as an example. However, the present disclosure is not limited thereto, and a thin film transistor of a top gate structure may also be formed, and details thereof are not described herein again. Hereinafter, a description will be made by taking a manufacturing method for an OLED substrate adopting with an oxide thin film transistor as an example. Certainly, a manufacturing method for an OLED substrate adopting with a low-temperature polysilicon thin film transistor is the similar, and details thereof are not described herein again.

In Step S2, a pattern including first electrodes 14 of OLED devices and a pixel defining layer provided on a layer in which the first electrodes are located is formed above the substrate 1 by a single patterning process. The pixel defining layer includes a plurality of pixel partition walls 15 spaced apart from each other, each of the pixel partition walls 15 defines one of the first electrodes 14.

The step S2 specifically includes the following steps S21 to S25.

Figure 4:
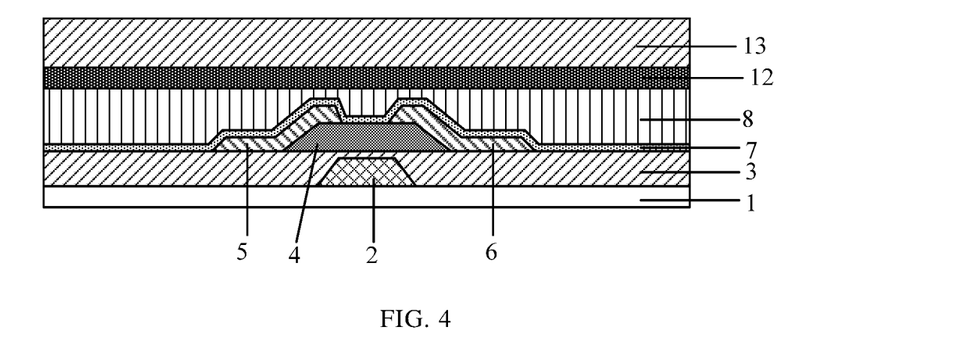
FIG. 4 is a schematic structural diagram of an OLED substrate, after a step S21 is completed, according to an embodiment of the present disclosure.

Referring to FIG. 4, in step S21, a material 12 for the first electrodes and a material 13 for the pixel defining layer are sequentially deposited above the base substrate 1. As can be seen from FIG. 4, the material 12 for the first electrodes is actually deposited on the planarization layer 8, and the material 13 for the pixel defining layer is deposited on the material 12 for the first electrodes.

In step S22, the material 13 for the pixel defining layer is exposed with different precisions to form a fully exposed area A, a partially exposed area B, and an unexposed area C. It should be noted that the exposure of different precisions in the present embodiment may be performed by using a gray scale mask or a halftone mask, which is not limited thereto. In this case, the material 13 for the pixel defining layer plays a role of photoresist layer in the related art, that is, the material 13 for the pixel defining layer can make the photoresist be omitted in addition to forming the pixel defining layer in the subsequent step.

Figure 5:
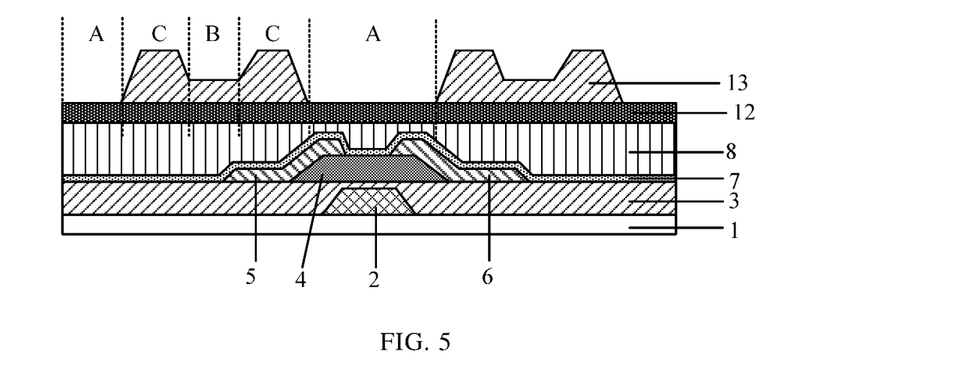
FIG. 5 is a schematic structural diagram of an OLED substrate, after a step S23 is completed, according to an embodiment of the present disclosure.

Referring to FIG. 5, in step S23, the exposed material 13 for the pixel defining layer in the fully exposed area A and the partially exposed area B are developed and etched to remove the material 13 for the pixel defining layer in the fully exposed area A to expose a portion of the material 12 for the first electrodes corresponding to the fully exposed area A.

As can be seen from FIG. 5, after performing the exposure of different precisions, the area where the material 12 for the first electrodes is completely exposed is the fully exposed area A, and the area where a thickness of the material 13 for the pixel defining layer is reduced is the partially exposed area B, and the area where a thickness of the material 13 for the pixel defining layer maintains unchanged is the unexposed area C.

Figure 6:
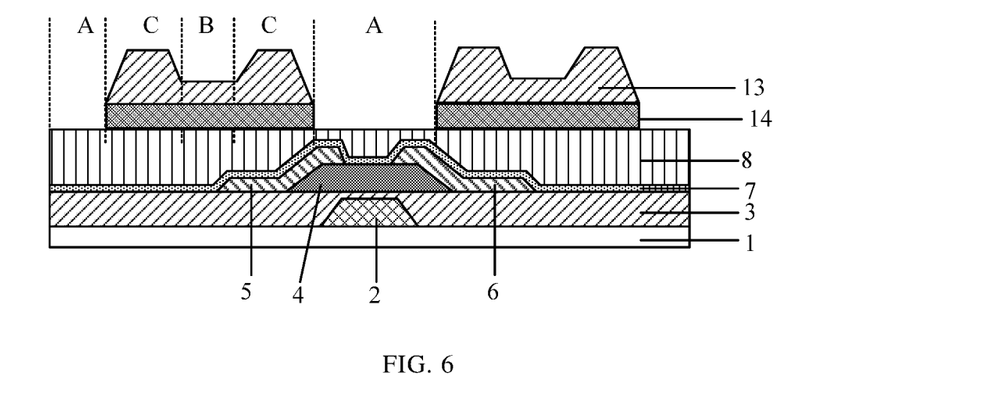
FIG. 6 is a schematic structural diagram of an OLED substrate, after a step S24 is completed, according to an embodiment of the present disclosure.

Referring to FIG. 6, in step S24, the exposed material 12 for the first electrode is etched to form the first electrodes 14.

In some embodiments, the first electrodes 14 are made of a conductive and reflective material. The reason for this is that the first electrodes 14 being formed by using the conductive and reflective material can reflect the light irradiated onto the first electrodes 14, so that ultraviolet light irradiated onto the first electrodes 14 cannot irradiate to the thin film transistor under the first electrodes 14, effectively protecting the characteristics of the thin film transistor from being affected by the ultraviolet light, thereby ensuring the stability of the OLED substrate.

In some embodiments, the first electrodes 14 are made of an ITO/Ag/ITO material. The reason for this is that the ITO/Ag/ITO material has high light emitting efficiency and electron extraction rate. Certainly, the material used for manufacturing the first electrodes 14 are not limited thereto, and other conductive material may be used, and details thereof are not described herein again.

Figure 7:
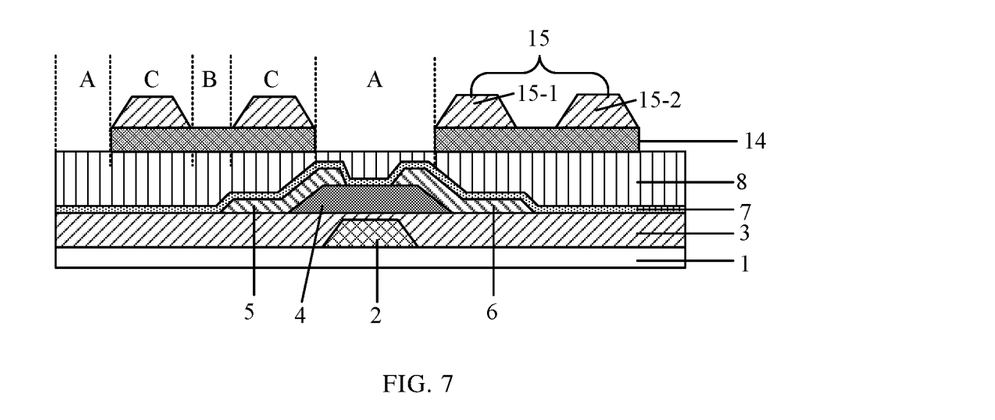
FIG. 7 is a schematic structural diagram of an OLED substrate, after a step S25 is completed, according to an embodiment of the present disclosure.

Referring to FIG. 7, in step S25, the remaining material 13 for the pixel defining layer in the partially exposed area B is removed to form the pixel partition walls 15.

In the present embodiment, the remaining material 13 for the pixel defining layer in the partially exposed area B may be removed by using an ashing process, thereby forming the pixel partition walls 15 (located in the unexposed areas C) in the pixel defining layer. As can be seen from FIG. 7, during the ashing process, the material 13 for the pixel defining layer in the partially exposed area B is removed, and the thickness of the material 13 for the pixel defining layer in the unexposed area C is reduced.

It should be noted that each of the first electrodes 14 of the OLED devices is formed with one pixel partition wall 15 thereon, and each of the pixel partition walls 15 includes two trapezoidal partition sub-walls 15-1 and 15-2 on each of the first electrodes 14 shown in FIG. 7. The plurality of pixel partition walls 15 together constitute the pixel defining layer, that is, in the present embodiment, the pixel defining layer is not of a continuous layer structure, but is of a discontinuous structure including a plurality of separated pixel partition walls 15.

Figure 8:
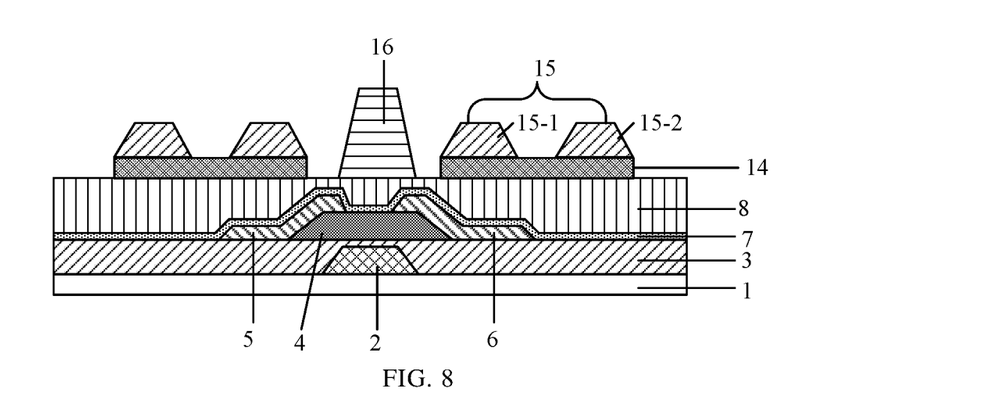
FIG. 8 is a schematic structural diagram of an OLED substrate, after a step S3 is completed, according to an embodiment of the present disclosure.

Referring to FIG. 8, in step S3, a spacer 16 is formed above the substrate 1 and between adjacent OLED devices.

As can be seen from FIG. 8, a spacer 16 is formed on the planarization layer 8 and between adjacent OLED devices, and the spacer 16 can be used for supporting an opposite substrate or a mask plate for forming color filters. It should be understood that a height of an upper surface of the spacer 16 should be greater than a height of an upper surface of the pixel partition wall 15.

Figure 9:
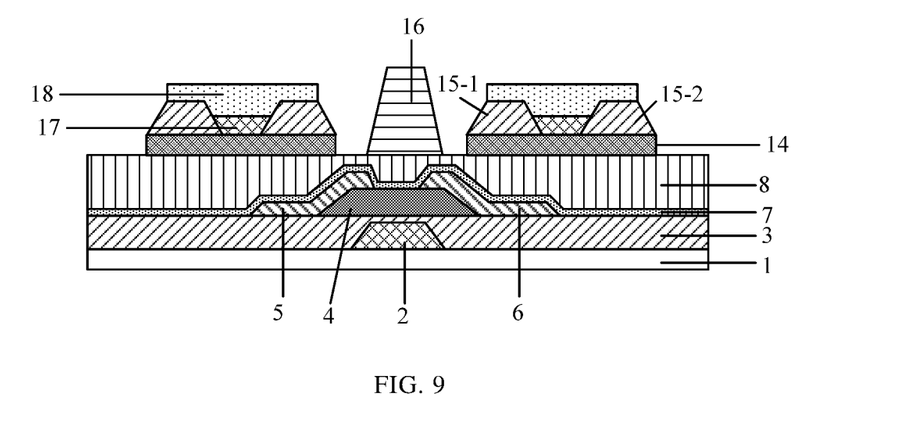
FIG. 9 is a schematic structural diagram of an OLED substrate, after a step S4 is completed, according to an embodiment of the present disclosure.

Referring to FIG. 9, in step S4, a light emitting layer 17 and a second electrode 18 are formed on each of the first electrodes 14. It should be noted that one of the first electrode 14 and the second electrode 18 is an anode, and the other is a cathode. In the present embodiment, the first electrode 14 is an anode, and the second electrode 18 is a cathode. Certainly, solutions of the present embodiment are not limited thereto, and the first electrode 14 may be a cathode, and the second electrode 18 may be an anode, and details thereof are not described herein again.

As can be seen from FIG. 9, the light emitting layer 17 is formed in the partially exposed area to be coupled to the first electrode 14 and between adjacent pixel partition sub-walls. The second electrode 18 is provided on the pixel partition wall 15 and is coupled to the light emitting layer 17. It should be noted that the second electrode 18 is also made of a conductive material. In the present embodiment, the light emitting layer 17 may be formed by an inkjet printing process, and the second electrode 18 may be formed by an evaporation process. Certainly, the patterning processes for forming the light emitting layer 17 and the second electrode 18 are not limited thereto, and details thereof are not described herein again.

The manufacturing method for an OLED substrate of the present embodiment includes: forming, by a single patterning process, a pattern including first electrodes 14 of OLED devices and a pixel defining layer provided above the first electrodes 14 above a base substrate 1, that is, the first electrodes 14 and the pixel defining layer can be manufactured by a single patterning process. Meanwhile, the pixel defining layer can serve as an etch protection layer (i.e., equivalent to the photoresist) for the first electrodes 14, thus the number of the patterning processes can be reduced by one, and the usage of the photoresist can be omitted, thereby greatly reducing the cost and increasing the productivity of the OLED substrate. In addition, the first electrodes 14 and the pixel defining layer are manufactured by a single patterning process, which can completely avoid pattern deviation, generated in the case where the first electrodes 14 and the pixel defining layer are separately manufactured, of the first electrodes 14 and the pixel defining layer, thereby increasing the aperture ratio of the OLED substrate. More- over, when the patterning process is performed, since the first electrodes 14 can reflect the light, the ultraviolet light cannot irradiate to the thin film transistor below the first electrodes 14, thereby effectively protecting the characteristics of the thin film transistor from being affected by the ultraviolet light, thereby ensuring stability of the OLED substrate.

An embodiment of the present disclosure provides a manufacturing method for a display device, including the steps of the manufacturing method for the OLED substrate in the above embodiment.

The manufacturing method for the display device of the present embodiment includes the manufacturing method for the OLED substrate of the above embodiment. The manufacturing method for the OLED substrate may refer to above description, and details thereof are not described herein again.

In the manufacturing method for the display device of the present embodiment, the first electrodes 14 and the pixel defining layer can be manufactured by a single patterning process. Meanwhile, the pixel defining layer can serve as an etch protection layer (i.e., equivalent to the photoresist) for the first electrode 14, thus the number of the patterning processes can be reduced by one, and the usage of the photoresist can be omitted, thereby greatly reducing the cost and increasing the productivity of the OLED substrate. In addition, the first electrodes 14 and the pixel defining layer are manufactured by a single patterning process, which can completely avoid pattern deviation, generated in the case where the first electrodes 14 and the pixel defining layer are separately manufactured, of the first electrodes 14 and the pixel defining layer, thereby increasing the aperture ratio of the OLED substrate. Moreover, when the patterning process is performed, since the first electrodes 14 can reflect the light, the ultraviolet light cannot irradiate to the thin film transistor below the first electrodes 14, thereby effectively protecting the characteristics of the thin film transistor from being affected by the ultraviolet light, thereby ensuring stability of the OLED substrate.

Referring to FIG. 9, an embodiment of the present disclosure provides an OLED substrate including a plurality of OLED devices, each of the OLED devices includes a first electrode 14 and a pixel defining layer provided on the first electrode 14, the pixel defining layer includes a plurality of pixel partition walls 15, a boundary of an area defined by an orthographic projection of each of the pixel partition walls 15 on the base substrate 1 coincides with a boundary of an area defined by an orthographic projection of the first electrode 14 of the OLED device on the base substrate 1.

That is to say, each of the pixel partition walls 15 is completely located on one corresponding first electrode 14, and therefore, the orthographic projection of each of the pixel partition walls 15 on the base substrate 1 falls within the orthographic projection of the first electrode 14, which is located below the pixel partition wall 15, on the base substrate 1.

The OLED substrate of the present embodiment is manufactured by using the manufacturing method for the OLED substrate in the above embodiment. Detail description of the manufacturing method for the OLED substrate may refer to the above embodiment, and details thereof are not described herein again.

The OLED substrate in the present embodiment is manufactured by using the manufacturing method for the OLED substrate of the above embodiment, the first electrodes 14 and the pixel defining layer can be manufactured by a single patterning process. Meanwhile, the pixel defining layer can serve as an etch protection layer (i.e., equivalent to the photoresist) for the first electrodes 14, thus the number of the patterning processes can be reduced by one, and the usage of the photoresist can be omitted, thereby greatly reducing the cost and increasing the productivity of the OLED substrate. In addition, the first electrodes 14 and the pixel defining layer are manufactured by a single patterning process, which can completely avoid pattern deviation, generated in the case where the first electrodes 14 and the pixel defining layer are separately manufactured, of the first electrodes 14 and the pixel defining layer, thereby increasing the aperture ratio of the OLED substrate. Moreover, when the patterning process is performed, since the first electrodes 14 can reflect the light, the ultraviolet light cannot irradiate to the thin film transistor below the first electrodes 14, thereby effectively protecting the characteristics of the thin film transistor from being affected by the ultraviolet light, thereby ensuring stability of the OLED substrate.

An embodiment of the present disclosure provides a display device including the OLED substrate in above embodiment. The display device may be a display product or a component with display function such as an electronic paper, an OLED panel, a mobile phone, a tablet computer, a television, a display, a notebook computer, a digital photo frame, a navigator and the like.

In the display device of the present embodiment, the first electrodes 14 and the pixel defining layer can be manufactured by a single patterning process. Meanwhile, the pixel defining layer can serve as an etch protection layer (i.e., equivalent to the photoresist) for the first electrodes 14, thus the number of the patterning processes can be reduced by one, and the usage of the photoresist can be omitted, thereby greatly reducing the cost and increasing the productivity of the OLED substrate. In addition, the first electrodes 14 and the pixel defining layer are manufactured by a single patterning process, which can completely avoid pattern deviation, generated in the case where the first electrodes 14 and the pixel defining layer are separately manufactured, of the first electrodes 14 and the pixel defining layer, thereby increasing the aperture ratio of the OLED substrate. Moreover, when the patterning process is performed, since the first electrodes 14 can reflect the light, the ultraviolet light cannot irradiate to the thin film transistor below the first electrodes 14, thereby effectively protecting the characteristics of the thin film transistor from being affected by the ultraviolet light, thereby ensuring stability of the OLED substrate.

It should be understood that, the foregoing embodiments are only exemplary embodiments used for explaining the principle of the present disclosure, but the present disclosure is not limited thereto. Various variations and improvements may be made by a person skilled in the art without departing from the spirit and essence of the present disclosure, and these variations and improvements also fall into the protection scope of the present disclosure.

The invention claimed is:

1. A manufacturing method for an OLED substrate, comprising:
    forming, by a single patterning process, a pattern including first electrodes of OLED devices and a pixel defining layer provided above the first electrodes above a base substrate, wherein the pixel defining layer includes a plurality of pixel partition walls spaced apart from each other, each of the pixel partition walls defines one of the first electrodes, which further comprises steps of:
        depositing a material for the first electrodes and a material for the pixel defining layer sequentially above the base substrate;
        exposing the material for the pixel defining layer with different precisions to form a fully exposure area, a partially exposure area and an unexposure area;
        developing and etching the material for the pixel defining layer in the fully exposure area and the partially exposure area to remove the material for the pixel defining layer in the fully exposure area to expose a portion of the material for the first electrodes corresponding to the fully exposure area;
        etching the material, which is exposed, for the first electrodes to form the first electrodes by using the patterned material for the pixel defining layer as an protection layer; and
        removing the material, which is remained, for the pixel defining layer in the partially exposure area to form the pixel partition walls, and wherein
    an orthographic projection of the pixel partition wall on the base substrate is within an orthographic projection of the first electrode of said each of the OLED devices on the base substrate, and wherein
    the manufacturing method further comprising:
        after the step of forming, by a single patterning process, a pattern including first electrodes of OLED devices and a pixel defining layer provided above the first electrodes above a base substrate, forming a spacer above the base substrate and between adjacent OLED devices, and
        an orthographic projection of the spacer on the base substrate is not overlapped with the orthographic projection of the pixel partition wall on the base substrate and the orthographic projection of the first electrode of the OLED device on the base substrate.

2. The manufacturing method for an OLED substrate according to claim 1, further comprising:
    before the step of forming, by a single patterning process, a pattern including first electrodes of OLED devices and a pixel defining layer provided above the first electrodes above a base substrate, forming layered-structures of a thin film transistor and a planarization layer sequentially on the base substrate.

3. The manufacturing method for an OLED substrate according to claim 2, wherein the thin film transistor is a low temperature polysilicon thin film transistor or an oxide thin film transistor.

4. The manufacturing method for an OLED substrate according to claim 2, wherein the first electrodes are made of a conductive and reflective material.

5. The manufacturing method for an OLED substrate according to claim 4, wherein the conductive and reflective material comprises ITO/Ag/ITO.

6. The manufacturing method for an OLED substrate according to claim 1, further comprising:
    after the step of forming, by a single patterning process, a pattern including first electrodes of OLED devices and a pixel defining layer provided above the first electrodes above a base substrate, forming a light emitting layer and a second electrode sequentially on each of the first electrodes.

7. The manufacturing method for an OLED substrate according to claim 1, wherein the first electrodes are made of a conductive and reflective material.

8. The manufacturing method for an OLED substrate according to claim 7, wherein the conductive and reflective material comprises ITO/Ag/ITO.

\* \* \* \* \*